(12) United States Patent
Ebihara

(10) Patent No.: US 6,391,503 B2
(45) Date of Patent: May 21, 2002

(54) SCANNING EXPOSURE METHODS

(75) Inventor: Akimitsu Ebihara, Kyoto (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/885,404

(22) Filed: Jun. 21, 2001

Related U.S. Application Data

(63) Continuation of application No. 09/749,561, filed on Dec. 28, 2000, now abandoned, which is a continuation of application No. 09/152,928, filed on Sep. 15, 1998, now abandoned.
(60) Provisional application No. 60/059,570, filed on Sep. 19, 1997.

(51) Int. Cl.[7] .............................. G03F 9/00; G03C 5/00
(52) U.S. Cl. .......................... 430/22; 430/30; 430/311
(58) Field of Search .............................. 430/22, 30, 311

(56) References Cited

U.S. PATENT DOCUMENTS

| | | |
|---|---|---|
| 4,425,508 A | 1/1984 | Lewis, Jr. et al. |
| 4,525,659 A | 6/1985 | Imahashi et al. |
| 4,750,721 A | 6/1988 | Sasada |
| 4,924,257 A | 5/1990 | Jain |
| 5,172,160 A | 12/1992 | Van Eijk et al. |
| 5,194,893 A | 3/1993 | Nishi |
| 5,208,497 A | 5/1993 | Ishii et al. |
| 5,229,670 A | 7/1993 | Kagawa |
| 5,504,407 A | 4/1996 | Wakui et al. |
| 5,528,118 A | 6/1996 | Lee |
| 5,537,260 A | 7/1996 | Williamson |
| 5,712,735 A | 1/1998 | Hashimoto et al. |
| 5,815,246 A | 9/1998 | Sperling et al. |
| 6,246,204 B1 | 6/2001 | Ebihara et al. |

FOREIGN PATENT DOCUMENTS

| | | |
|---|---|---|
| GB | 2 290 658 A | 1/1996 |
| JP | A-56-111218 | 9/1981 |
| JP | A-62-108185 | 5/1987 |
| JP | A-8-63231 | 3/1996 |
| JP | A-8-166475 | 6/1996 |

OTHER PUBLICATIONS

Buckley, Jere D. et al., "Step and Scan: A Systems Overview of a New Lithography Tool," SPIE vol. 1088 Optical Laser Microlithography II (1989), 424–433.

*Primary Examiner*—Christopher G. Young
(74) *Attorney, Agent, or Firm*—Oliff & Berridge PLC

(57) ABSTRACT

Since a mask stage 16 and a substrate stage 14 are supported in a floating manner over a base member 12, the both stages are driven in mutually opposite directions in a non-contact manner along the scanning direction by the aid of a linear motor 13. During this process, the movement of the both stages 16, 14 does not exert any force on the base member 12 and other components, and thus the momentum is conserved. The mass ratio between the stage 16 and the stage 14 is set to be identical with a reduction magnification of an unillustrated projection optical system. Therefore, according to the law of conservation of momentum, the velocity ratio between the stage 16 and the stage 14 is a reciprocal number of the reduction magnification of the projection optical system. Thus, the both stages 16, 14 are subjected to accurate synchronous control. It is possible to suppress inclination and fluctuation of the entire apparatus, and it is possible to improve the synchronization performance of the mask stage and the substrate stage.

101 Claims, 6 Drawing Sheets

SCANNING EXPOSURE METHODS

This is a Continuation of application Ser. No. 09/749,561 filed Dec. 28, 2000, now abandoned which in turn is a Continuation of application Ser. No. 09/152,928 filed Sep. 15, 1998, now abandoned. The entire disclosure of the prior application(s) is hereby incorporated by reference herein in its entirety. This nonprovisional application claims the benefit of U.S. Provisional Application No. 60/059,570 filed Sep. 19, 1997.

TECHNICAL FIELD

The present invention relates to an exposure apparatus and an exposure method. In particular, the present invention relates to an exposure apparatus, especially a scanning exposure apparatus and a scanning exposure method in which a mask held by a mask stage and a photosensitive substrate held by a substrate stage are subjected to scanning in a synchronized manner by using an illumination light beam, so as to transfer, onto the photosensitive substrate, a pattern such as a semiconductor circuit pattern and a liquid crystal circuit pattern formed on the mask via a projection optical system.

BACKGROUND ART

Recently, a scanning type exposure apparatus based on the step-and-scan system (hereinafter referred to as "S&S system", if necessary), which realizes a resolution line width of not more than 0.5 μm, has been developed as an exposure apparatus for producing semiconductor elements. The apparatus is being actively improved in order to realize genuine and practical use for the semiconductor production line. The exposure apparatus based on the S&S system is disclosed, for example, in (1) Japanese Laid-Open Patent Publication No. 56-111218, (2) SPIE Vol. 1088 Optical/Laser Microlithography II (1989), pp. 424–433, (3) Japanese Laid-Open Patent Publication No. 2-229423, and (4) Japanese Laid-Open Patent Publication No. 4-277612.

Among them, in order to use mirror projection of 1× magnification in the S&S system, the above-mentioned patent document (1) discloses a system in which the mask is linearly moved in the scanning direction during scanning exposure, while the semiconductor wafer is moved in the scanning direction in a scanning manner, and it is moved in a direction perpendicular thereto in a stepwise manner. The above-mentioned document (2) discloses a reduction projection scanning exposure apparatus of the S&S system which uses a 1/4 reduction projection optical system having a circular arc-shaped slit field constructed by combining an optical lens and a reflecting mirror so as to accurately control the velocity ratio between the mask (or reticle) and the wafer to be 4:1 during scanning exposure. The above-mentioned patent document (3) discloses an apparatus in which an excimer laser is used as an illumination light beam, and an effective projection area is subjected to restriction to a regular hexagon which is inscribed in a circular image field of an ordinary reduction projection lens system to perform exposure based on the S&S system. The above-mentioned patent document (4) discloses an apparatus in which an effective projection area is subjected to restriction to a linear slit-shaped (rectangular) area which is formed along a diameter of a circular image field of an ordinary reduction projection lens system to perform exposure based on the S&S system.

Besides, in order to obtain a higher resolving power, Japanese Laid-Open Patent Publication No. 6-300973 (5) discloses a reduction projection optical system comprising a plurality of optical lenses, a beam splitter, and a concave mirror, the system being applied to an ArF excimer laser having a wavelength of not more than 200 nm as an illumination light beam for exposure. A similar projection optical system is also disclosed in Japanese Laid-Open Patent Publication No. 5-88087 applied by the same applicant as that of the present application.

In the respective conventional techniques described above, the scanning type exposure apparatus based on the use of the reduction projection optical system generally adopts the system in which the reticle stage for holding the reticle and the wafer stage for holding the wafer are moved in a scanning manner at a velocity ratio which coincides with a reciprocal number of a reduction magnification of the projection optical system. Therefore, it has been necessary that a driving source (for example, a linear motor) for the reticle stage and a driving source (for example, a linear motor) for the wafer stage should be individually provided on an apparatus body (for example, a column for fixing the projection optical system thereon) to precisely control the both driving sources in a synchronized manner so that the reticle and the wafer are relatively moved while maintaining a constant velocity ratio. Namely, such a system requires the linear motor for linearly moving the reticle stage with respect to the projection optical system during scanning exposure, the linear motor for linearly moving the wafer stage with respect to the projection optical system, and a servo control circuit for individually and precisely controlling the respective linear motors on the basis of measured values obtained by laser interferometers for individually measuring the position of movement of the respective stages with respect to the projection optical system.

In the case of the scanning type exposure apparatus based on the use of the reduction projection optical system as described above, a method is generally adopted in which a stage having superior characteristics runs after a stage having inferior characteristics, because the reticle stage (mask stage) and the wafer stage (substrate stage) have different dynamic characteristics respectively. However, such a scanning type exposure apparatus has the following inconvenience. Namely, the stage having inferior characteristics is slow in setting adjustment, because it is affected, for example, by fluctuation of the body so serve as a backbone of the apparatus. In order to improve the synchronization performance, it is necessary to use a stage having extremely excellent dynamic characteristics, as the stage having superior characteristics. Moreover, it is necessary and indispensable to use a special unit such as a so-call active vibration-removing apparatus (vibration-preventive apparatus) for reducing fluctuation of the body. Therefore, the system of the apparatus is complicated to that extent, and the cost becomes expensive.

Further, the scanning exposure apparatus based on the use of the reduction projection system, in which the optical axis ranging from the reticle to the wafer is linear, has the following inconvenience, as in the apparatuses described in the foregoing patent documents (3) and (4). Namely, the reticle stage and the wafer stage are generally arranged so that both of them are moved in the horizontal direction. Further, the reticle stage and the wafer stage are disposed so that they are separated from each other in the vertical direction by a distance of about 80 to 150 cm. Accordingly, the reticle stage is arranged at an upper position of the body of the exposure apparatus. Therefore, the entire apparatus may be inclined due to scanning movement of the reticle stage during scanning exposure in some cases. In other cases, excessive stress may be applied to the respective structural components (for example, the column, and the base plate) for constituting the apparatus body.

The conventional apparatus has also involved the following inconveniences. Namely, disorder occurs in synchronous control for the linear motor for the reticle stage and the linear motor for the wafer stage. Further, the transfer magnification becomes non-uniform in relation to the scanning direction concerning the pattern image transferred to the shot area on the wafer if the interferometer suffers measurement error (count mistake).

The present invention has been made considering the inconveniences involved in the conventional technique as described above, an object of which is to provide an exposure apparatus and a scanning exposure apparatus each of which has a simple structure and makes it possible to reduce the stress generated in the structural components for constructing the apparatus, suppress inclination and fluctuation of the entire apparatus, and improve the synchronization performance of the mask stage and the substrate stage.

Another object of the present invention is to provide a scanning exposure method which makes it possible to reduce the stress generated in the exposure apparatus, suppress inclination and fluctuation of the entire apparatus, and improve the synchronization performance of the mask stage and the substrate stage.

DISCLOSURE OF THE INVENTION

According to a first aspect of the present invention, there is provided an exposure apparatus for transferring a pattern formed on a mask onto a photosensitive substrate through a projection optical system while synchronously moving the mask and the photosensitive substrate, the exposure apparatus comprising:

a substrate stage supported in a floating manner over a base member;

a mask stage supported in a floating manner over the base member and having a mass corresponding to an amount obtained by multiplying a mass of the substrate stage by a reduction magnification of the projection optical system; and a first linear motor provided between the both stages, for driving the substrate stage and the mask stage so that the mask and the substrate are moved in mutually opposite directions.

According to the exposure apparatus, the mask stage and the substrate stage are supported in the floating manner on the base member. Therefore, the both stages are driven by the first linear motor in the mutually opposite directions while making no contact along the movement direction. During this process, no force is exerted at all on the base member and other components by the movement of the both stages. Thus, the momentum is conserved. In the present invention, the mass of the mask stage corresponds to the amount obtained by magnifying the mass of the substrate stage by the reduction magnification. Therefore, according to the law of conservation of momentum, the velocity ratio between the mask stage and the substrate stage is a reciprocal number of the reduction magnification of the projection optical system, and thus the both stages are subjected to accurate synchronous control. The position of the center of gravity of the entire system scarcely changes, and hence the main body including the base member is neither fluctuated nor inclined due to the movement of the both stages (synchronous scanning for the mask and the substrate).

The exposure apparatus of the present invention may be constructed such that the projection optical system is an optical system which projects an inverted image of the pattern formed on the mask onto the photosensitive substrate. When the exposure apparatus is constructed as described above, the photosensitive substrate is accurately exposed by projection with the image of the pattern when the mask stage and the substrate stage are synchronously moved in the mutually opposite directions by the aid of the first linear motor.

The exposure apparatus of the present invention may be constructed such that the photosensitive substrate is held horizontally on the substrate stage, the mask is held vertically on the mask stage, and the projection optical system comprises a plurality of transmitting optical elements, a beam splitter, and a reflecting optical element, wherein the optical system projects the pattern of the mask arranged on an object plane onto the photosensitive substrate arranged on an image formation plane at a predetermined reduction magnification. When the exposure apparatus is constructed as described above, it is possible to arrange a half TTL alignment detection system on a side opposite to the mask stage in relation to the beam splitter. By doing so, the alignment mark formed on the mask can be detected separately from or simultaneously with the alignment mark formed on the photosensitive substrate by using the half TTL alignment detection system by the aid of the beam splitter. Accordingly, the detection of the reticle alignment mark and the detection of the wafer alignment mark can be conveniently performed by using the single detecting system.

The exposure apparatus of the present invention may be constructed such that a second linear motor for driving the mask stage is provided between the base member and the mask stage. According to this structure, the mask stage can be driven independently from the base member by driving the second linear motor in a state in which the first linear motor is turned OFF. Accordingly, it is possible to perform positional resetting and fine adjustment for the mask stage.

The exposure apparatus of the present invention may be constructed such that a third linear motor for driving the substrate stage is provided between the base member and the substrate stage. When the exposure apparatus is constructed as described above, the substrate stage can be driven independently from the base member by driving the third linear motor in a state in which the first linear motor (and the second linear motor) is/are turned OFF. Accordingly, it is possible to perform positional resetting and fine adjustment for the substrate stage.

The exposure apparatus of the present invention may be constructed such that a regenerative braking circuit for finely adjusting a velocity ratio during synchronous movement of the both stages effected by the first linear motor is provided together with at least one of the second linear motor and the third linear motor. When the exposure apparatus is constructed as described above, at least one of the second linear motor and the third linear motor is allowed to perform the regenerative braking action by the aid of the regenerative braking circuit. Thus, the apparent mass of at least any one of the mask stage and the substrate stage which are moved in the mutually opposite directions by the first linear motor can be increased to finely adjust the velocity ratio between the both stages during the movement. The term "regenerative braking" refers to occurrence of the braking action brought about by allowing the motor to function as a kind of generator. Accordingly, the load to be driven by the first linear motor can be increased. Namely, it is possible to increase the apparent mass of at least one of the mask stage and the substrate stage. According to the exposure apparatus in conformity with the foregoing construction, when the mass ratio between the both stages is not accurately set to be a desired value, the velocity ratio between the both stages can be adjusted to ensure desired synchronization performance. Besides, it is possible to ensure stable synchronization performance even when the momentum is not completely conserved by always making the velocity ratio between the both stages to coincide with the reciprocal number of the reduction magnification of the projection optical system by appropriately adjusting the regenerative braking amount during the movement (scanning).

The exposure apparatus of the present invention may be constructed such that the substrate stage comprises a first stage which is movable in a first direction in which the photosensitive substrate is synchronously moved, and a second stage which is movable in the first direction integrally with the first stage while holding the photosensitive substrate and which is movable in a second direction perpendicular to the first direction by being guided by the first stage. When the exposure apparatus is constructed as described above, the second stage for holding the substrate is moved in the first direction integrally with the first stage to perform scanning exposure, and then the second stage is moved in the second direction perpendicular to the first direction with respect to the first stage. By repeating this process, it is possible to easily realize exposure based on the so-called step-and-scan system.

According to a second aspect of the present invention, there is provided a scanning exposure apparatus including a projection optical system having an optical axis substantially perpendicular to a mask and a substrate respectively, for transferring a pattern formed on the mask onto the substrate through the projection optical system, the scanning exposure apparatus comprising:

a base;

a first stage for moving the mask over the base;

a second stage for moving the substrate over the base; and a driving system connected to the first stage and the second stage, for synchronously moving the mask and the substrate at a velocity ratio corresponding to a magnification of the projection optical system, wherein:

the driving system drives the first stage and the second stage along predetermined directions oppositely to one another so that a reactive force generated by the synchronous movement is offset.

According to a third aspect of the present invention, there is provided a scanning exposure method for transferring a pattern formed on a mask onto a substrate through a projection optical system, the scanning exposure method comprising the steps of:

arranging the mask and the substrate in an identical plane perpendicular to an optical axis of the projection optical system;

projecting a partial inverted image of the pattern formed on the mask onto the substrate; and synchronously moving the mask and the substrate oppositely to one another along predetermined directions on the plane so that a reactive force generated by the synchronous movement is substantially offset.

BEST MODE FOR CARRYING OUT THE INVENTION

Figure 1:
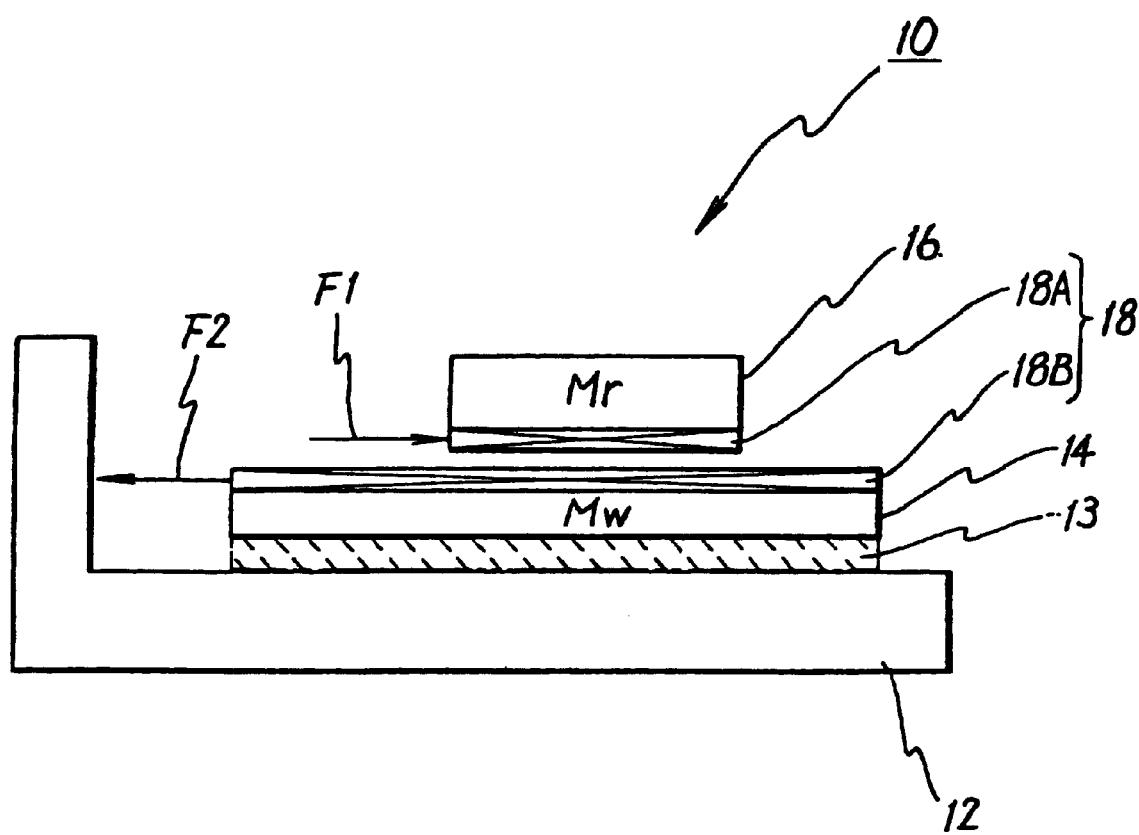
FIG. 1 shows a fundamental construction of the present invention.

The fundamental construction of the exposure apparatus according to the present invention will be explained below with reference to FIG. 1. FIG. 1 shows the fundamental construction of the exposure apparatus 10 according to the present invention. The exposure apparatus 10 comprises vibration-preventive pedestal 12 as a base member, a substrate stage 14 supported in a floating manner over the vibration-preventive pedestal 12 via an air bearing (air-operated bearing) 13, and a mask stage 16 supported in a floating manner over the substrate stage 14. A linear motor 18 is provided between the substrate stage 14 and the mask stage 16. Namely, for example, a driving coil 18A of the linear motor 18 is disposed on a side of the mask stage 16 having a mass Mr, and a magnet track section 18B of the linear motor 18 is disposed on a side of the substrate stage 14 having a mass Mw. The ratio between the mass Mr of the mask stage 16 and the mass Mw of the substrate stage 14 corresponds to a reduction magnification of an unillustrated projection optical system.

In the exposure apparatus 10 according to the present invention constructed as described above, the both stages 14, 16 are supported in the floating manner. Therefore, when the linear motor 18 is excited, only the internal force makes the action, wherein the force of action F1 and the force of reaction F2, which are equal to one another in magnitude and opposite in direction (F2=−F1), are applied to the respective stages 16, 14. Assuming that the velocities of movement of the both stages 16, 14 generated by the forces are Vr and Vw, and air resistance or the like is neglected, the following expression is given according to the law of conservation of momentum:

$$Mr \cdot Vr = Mw \cdot Vw$$

Therefore, the velocity ratio between the both stages 16, 14 is given as follows:

$$Vr/Vw = Mw/Mr$$

However, in the present invention, the ratio Mr/Mw between the masses of the both stages 16, 14 is set to be equal to the reduction magnification Mp1 of the unillustrated projection optical system as described above, and hence the following expression is given:

$$Vr/Vw = Mw/Mr = 1/Mp1$$

Accordingly, the velocity ratio between the both stages 16, 14 coincides with the reciprocal number of the reduction magnification of the projection optical system. Therefore, in an ideal state, when a system to conserve the momentum is constructed, the both stages 14, 16 can be always subjected to synchronous scanning (movement) in a reliable manner by servo-controlling the velocity (or position) of only one of the substrate stage 14 and the mask stage 16.

For example, when the mask stage 16 is servo-controlled, if the mask stage 16 makes vibrative action, then the substrate stage 14 makes vibrative action similar to that of the mask stage 16 at the same velocity ratio as the reciprocal number of the mass ratio. Further, the position of the center of gravity of the system is always constant, because the momentum is conserved. Accordingly, the vibration-preventive pedestal 12 is not fluctuated. Therefore, the synchronization error during scanning is always zero between the both stages 16, 14 (between the mask and the substrate held by the both stages 16, 14 respectively).

EMBODIMENTS

First Embodiment

Figure 2:
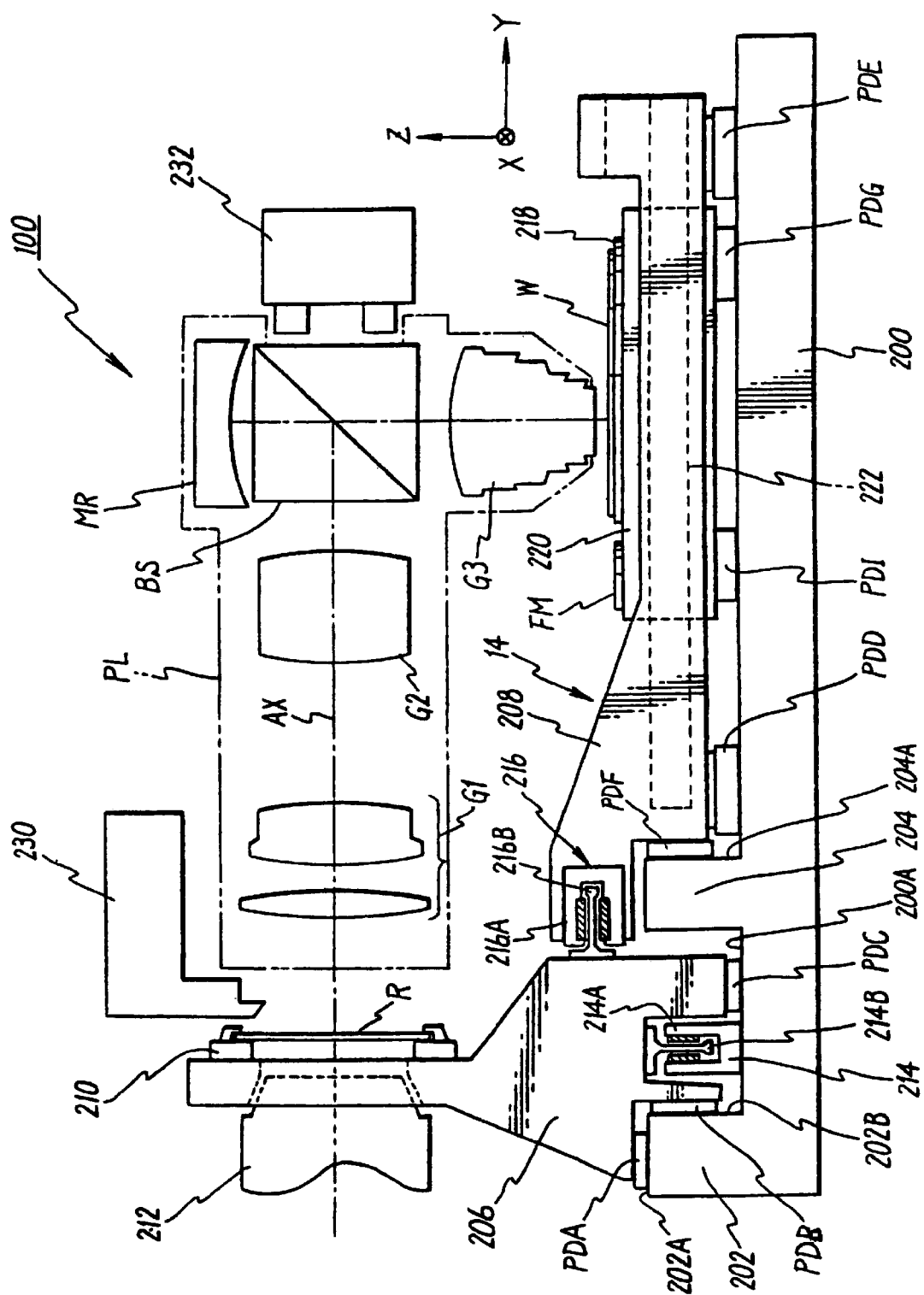
FIG. 2 shows a schematic arrangement illustrating an exposure apparatus according to a first embodiment.
Figure 3:
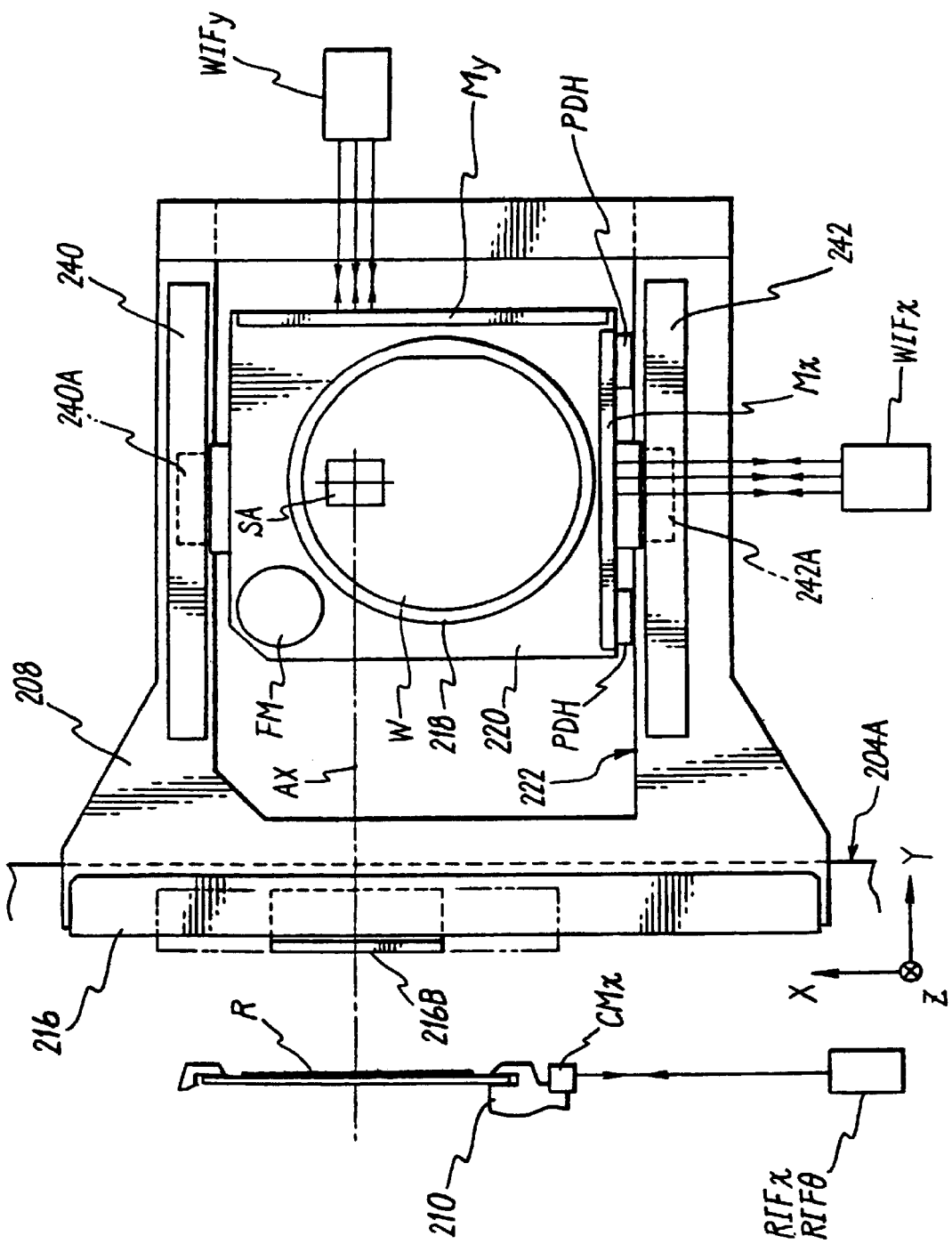
FIG. 3 shows a schematic plan view illustrating the apparatus shown in FIG. 1.

The first embodiment of the present invention will be explained with reference to FIGS. 2 to 4. FIGS. 2 and 3 show the arrangement of main components of an exposure apparatus 100 of the step-and-scan system according to the first embodiment.

The exposure apparatus 100 comprises a base structure 200 as a base member held horizontally on an unillustrated vibration-preventive pad, a wafer stage 14 as a substrate stage supported in a floating manner over the base structure 200, a reticle stage body 206 as a mask stage supported in a floating manner over the base structure 200, a projection optical system PL held by an unillustrated main column body over the wafer stage 14 and fixed to the base structure 200, and an illumination optical system 212 also held by the unillustrated main column body and fixed to the base structure 200. In this embodiment, the wafer stage 14 comprises a first wafer stage body 208 as a first stage which is movable in the X direction (scanning direction), and a second wafer stage body 220 as a second stage which is guided by the first stage body 208 and which is movable in the Y direction perpendicular to the X direction. Specified arrangement of these components will be described in detail later on.

Two prism-shaped fixed guide rails 202, 204, which extend in parallel to one another in the X direction (direction perpendicular to the plane of the paper) perpendicular to the Y direction, are provided to protrude at a portion of a first end (left end) in the Y direction in FIG. 2, on the upper surface of the base structure 200. Other portions of the upper surface of the base structure 200 are polished to be flat to support the respective movable bodies (stages) in the Z direction and smoothly move them in the XY plane. One of the fixed guide rails 202 is formed with a guide surface 202A for restricting, in the Z direction, the reticle stage body 206 which is movable in the X direction, and a guide surface 202B for restricting the reticle stage body 206 in the Y direction. The other fixed guide rail 204 is formed with a guide surface 204A for restricting, in the Y direction, the first wafer stage body 208 which is movable in the X direction.

As shown in FIG. 2, this embodiment uses the reticle stage body 206 of the vertical type for vertically holding a reticle R as a mask. The reticle stage body 206 is provided with a reticle fine movement stage 210 for vertically holding the reticle R to perform translational fine movement and rotational fine movement in a plane (XZ plane in FIG. 2) perpendicular to the optical axis AX of the projection optical system PL.

The illumination optical system 212 is disposed on a side opposite to the projection optical system PL in relation to the reticle R, which radiates a rectangular pattern area on the reticle R with an illumination light beam having an intensity distribution extending in a form of slit (or a rectangular form) in the direction perpendicular to the scanning direction (X direction) during scanning exposure. The portion of the pattern on the reticle R, which is irradiated with the linear slit-shaped illumination light beam, is disposed at the center of a circular field on the side of the object plane which is perpendicular to the horizontal optical axis AX of the projection optical system PL. The pattern is projected onto the wafer W at a resolving power of, for example, not more than 0.35 µm via the projection optical system PL having a predetermined reduction magnification Mp1 (1/4 in this embodiment) which is constructed to be telecentric on both sides by a first lens group G1, a second lens group G2, and a third lens group G3 to serve as transmitting optical elements, a beam splitter BS as a beam-splitting unit, and a concave mirror MR as a reflecting optical element. This embodiment uses the projection optical system which projects, onto the wafer W, an inverted image (inverted on the X axis) of the unillustrated circuit pattern formed on the pattern plane on the reticle R. Detailed arrangement of such a projection optical system PL is particularly disclosed, for example, in Japanese Laid-Open Patent Publication Nos. 5-88087 and 6-300973 referred to above. Accordingly, further detailed explanation will be omitted herein.

Those fixed at the bottom of the reticle stage body 206 are a pad PDA for air bearing (air-operated bearing) for supporting the self-weight of the reticle stage body 206 opposing to the guide surface 202A of the fixed guide rail 202, a pad PDB for air bearing for restricting displacement in the Y direction of the reticle stage body 206 opposing to the guide surface 202B of the fixed guide rail 202, and a pad PDC for air bearing for supporting the self-weight of the reticle stage body 206 opposing to the surface 200A of the base structure 200 located between the fixed guide rails 202 and 204. Among these pads, the pad PDB for restricting displacement in the Y direction is composed of an air pressure/vacuum combination type pad (vacuum pre-loaded air bearing) constructed by combining a plurality of air pad sections for ejecting pressurized air, and a plurality of vacuum pad sections arranged alternately therewith in the X direction (direction perpendicular to the plane of the paper) for sucking air. The air pressure/vacuum combination type pad functions such that the reticle stage body 206 is supported in a floating manner while being separated from the guide surface by a predetermined clearance owing to the balance between the suction force (pre-loaded pressure) exerted by the vacuum pad sections and the pressure of air ejected from the air pad sections. In the case of the pad PDA and the pad PDC, the self-weight of the reticle stage body 206 acts as a pre-loaded pressure. Accordingly, the reticle stage body 206 is supported in a floating manner while being separated from the guide surface by a predetermined clearance owing to the balance between the self-weight and the pressure of air ejected from the pad PDA and the pad PDC. In the following description, the phrase "the pad supports the self-weight" will be also used in this meaning.

The wafer stage 14, which comprises the first wafer stage body 208 and the second wafer stage body 220, is supported in a floating manner over the upper surface of the base structure 200 at a second end portion in the Y direction of the fixed guide rail 204.

The first wafer stage body 208 is formed to have a rectangular frame-shaped configuration extending over the XY plane over the base structure 200 (see FIG. 3). The self-weight of the first wafer stage body 208 is supported by pads PDD, PDE which serve as air bearings arranged at four corners opposing to the upper surface of the base structure 200. Displacement of the first wafer stage body 208 in the Y direction (right and left directions in the plane of the paper) is restricted by an air pressure/vacuum combination type pad PDF which is fixed to the first wafer stage body 208 opposing to the vertical guide surface 204A of the fixed guide rail 204. Accordingly, the first wafer stage body 208 is movable in a friction-less manner in the X direction by being guided by the guide surface 204A and the surface of the base structure 200.

A first linear motor 216, which is arranged along the X direction, is provided between the first wafer stage body 208 and the reticle stage body 206. The first linear motor 216 comprises a magnet track section 216A fixed on a side of the first wafer stage body 208 and extending over a movement stroke in the X direction (the magnet track section 216A comprises a yoke having a ]-shaped cross section extending in the X axis direction, and a pair of magnets fixed to upper and lower surfaces of the yoke), and a driving coil section 216B fixed on a side of the reticle stage body 206. Thus, the first linear motor 216 generates the thrust force in the X direction. Namely, in the first embodiment, for example, when the reticle stage section 206 is driven toward the front of the plane of the paper integrally with the driving coil section 216B by driving the linear motor 216, the reaction of the foregoing operation is generated to drive the wafer stage 14 toward the back of the plane of the paper integrally with the magnet track section 216A.

The reticle stage body 206 is movable singly in the X direction by the aid of a second linear motor 214 provided along the X direction. The linear motor 214 comprises a magnet track section 214A fixed on a side of the base structure 200 and extending over a movement stroke in the X direction of the reticle stage body 206 (the magnet track section 214A comprises a yoke having a U-shaped cross section fixed on the guide surface 200A, and a pair of magnets fixed to right and left inner surfaces of the yoke), and a driving coil section 214B fixed on a side of the reticle stage body 206. Thus, the second linear motor 214 generates the thrust force in the X direction. The second linear motor 214 is used to restore the reticle stage body 206 to a predetermined reset position. Besides, the second linear motor 214 has various other roles which will be described later on.

As shown in FIGS. 2 and 3, a second wafer stage body 220, which carries a wafer holder 218 for vacuum-sucking the wafer W, and fiducial mark plate FM, is held movably in the Y direction at the inside of the frame of the first wafer stage body 208. FIG. 3 shows the arrangement of the wafer stage body as viewed on the XY plane. As shown in FIG. 2, a plurality of pads PDI, PDG for air bearings for supporting the self-weight of the second wafer stage body 220, are attached to lower portions of the second wafer stage body 220 opposing to the upper surface of the base structure 200.

As also shown in FIG. 3, a guide surface 222 for guiding the second wafer stage body 220 in the Y direction (or for restricting displacement in the X direction) is formed on any one of inner surfaces of two straight frame sections of the first wafer stage body 208 extending in the Y direction and interposing the second wafer stage body 220. A pair of air pressure/vacuum combination type pads PDH, which are opposed to the guide surface 222, are fixed to first end portions of the second wafer stage body 220.

Further, as shown in FIG. 3, a pair of linear motors 240, 242 for moving the second wafer stage body 220 in the Y direction with respect to the first wafer stage body 208 are provided between the second wafer stage body 220 and the respective two straight frames of the first wafer stage 208 extending in the Y direction. Respective driving coil sections 240A, 242A of the pair of linear motors 240, 242 are fixed on both sides of the second wafer stage body 220. Accordingly, the second wafer stage body 220 can be finely rotated (in an order of second) on the surface of the base structure 200 by delicately changing the driving amounts of the respective linear motors 240, 242.

Now, the mesial conformation concerning the reticle R and the first and second wafer stage bodies 208, 220 on the XY plane will be further explained with reference to FIG. 3. In FIG. 3, the movement position of the reticle R in the X direction (scanning direction) in the XZ plane and the minute rotation amount (yawing error) of the reticle R in the XZ plane are successively measured by radiating a length-measuring laser beam onto a reflecting mirror CMx fixed to a portion of the fine movement stage 210 provided on the reticle stage body 206, and receiving a reflected beam therefrom by using laser interferometers RIFX, RIFO. Although not illustrated in any of FIGS. 2 and 3, a laser interferometer RIFy is also provided for successively measuring the position concerning the reticle fine movement stage 210 in the Z direction (the vertical direction in the plane of the paper in FIG. 2 or the direction perpendicular to the plane of the paper in FIG. 3). In this embodiment, the laser interferometer RIFy measures the position in the Z direction of the reticle fine movement stage 210. However, considering the wafer stage coordinate system, the position in the Z direction corresponds to the position in the Y direction, and hence the reference symbol "laser interferometer RIFy" is consciously used. Therefore, the measured value obtained by using the laser interferometer RIFy is expressed as PY in the following description.

The coordinate position of the wafer W in the XY plane is successively measured by a laser interferometer WIFy for radiating a length-measuring laser beam onto a movement mirror My provided at the second end (right end) in the Y direction of the second wafer stage body 220 to extend in the X axis direction and receiving a reflected light beam therefrom, and a laser interferometer WIFx for radiating a length-measuring laser beam onto a movement mirror Mx provided at the first end in the X direction of the second wafer stage body 220 to extend in the Y axis direction and receiving a reflected light beam therefrom. The respective interferometers WIFx, WIFy simultaneously measure, in a successive manner, the minute rotation amount (yawing error) of the second wafer stage body 220. The movement mirrors and the interferometers are omitted from the illustration in FIG. 2.

Plane mirrors and corner prisms (any of which are not shown), which serve as references for any of the respective interferometers RIFx, RIFθ, RIFy, WIFx, WIFy, are fixed to the base structure 200 so that the coordinate positions of the reticle R and the wafer W are measured on the basis of the base structure 200.

One shot area SA is illustrated on the wafer W shown in FIG. 3. The state shown in FIG. 3 represents a moment at which the central point of the shot area SA is just coincident with the vertical optical axis AX of the projection optical system PL (the optical axis of the lens group G3 shown in FIG. 2). At this point of time, the central point of the pattern area on the reticle R is also just coincident with the horizontal optical axis AX (the optical axis of the lens groups G1, G2 shown in FIG. 2).

The exposure apparatus 100 according to the first embodiment further comprises an alignment optical system 230 of the TTL (through-the-lens) system for photoelectrically detecting an alignment mark formed on the wafer W or the fiducial mark plate FM from a position located between the projection optical system PL and the reticle R via a peripheral portion in the projection field of the projection optical system PL, and an alignment optical system 232 of the half TTL system for detecting an alignment mark on the wafer W or the fiducial mark plate FM via the beam splitter BS and the third lens group G3, and for detecting an alignment mark on the reticle R via the beam splitter BS and the first and second lens groups G1, G2.

In the exposure apparatus 100 constructed as described above, the ratio between the total value Mr of the masses of both of the reticle stage body 206 and the reticle fine movement stage 210 and the mass of the wafer stage 14, i.e., the total value Mw of the masses of both of the first wafer stage body 208 and the second wafer stage body 220 is designed to be equal to the reduction magnification Mp1 of the projection optical system PL. In the case of this embodiment, the magnification Mp1 of the projection optical system is 1/4 as described above. Accordingly, the mass ratio Mr/Mw is also set to be 1/4. Specifically, for example, although the situation greatly depends on the diameter of the wafer W to be used, it is possible to set the total mass Mw of the wafer stage body to be about 40 to 100 Kg, and it is possible to set the total mass Mr of the reticle stage body to be about 10 to 25 Kg.

Figure 4:
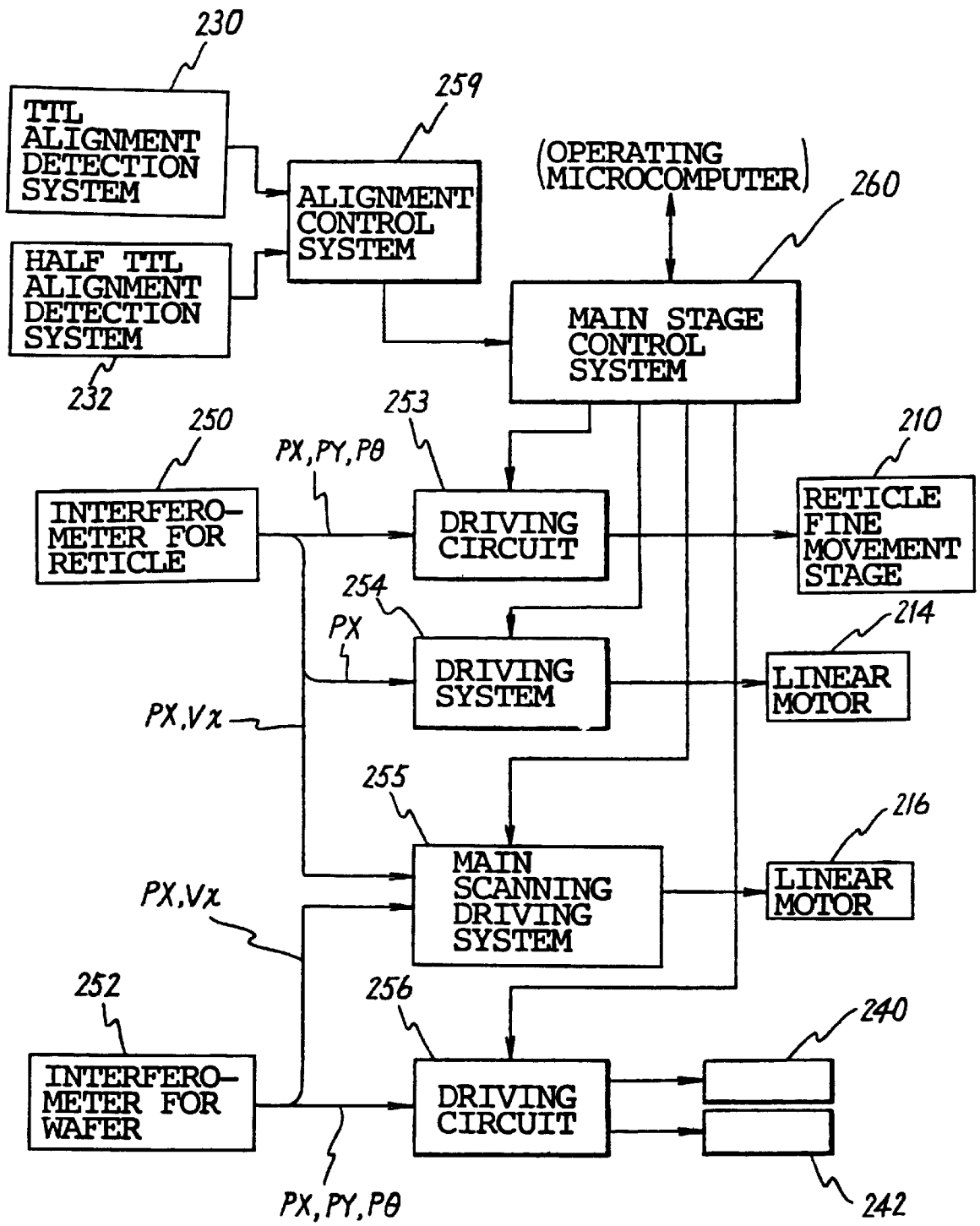
FIG. 4 shows a block diagram illustrating an arrangement of a control system of the apparatus shown in FIG. 1.

FIG. 4 shows an arrangement of a control system for the exposure apparatus 100 according to the first embodiment. The control system comprises, for example, an alignment control system 259, a main stage control system 260, a driving circuit 253, a driving system 254, a main scanning driving system 255, and a driving circuit 256. Now, the respective constitutive components of the control system will be explained together with the function thereof.

The detection information from the TTL alignment detection system 230 and the detection information from the half TTL alignment detection system 232 are inputted into the alignment control system 259 which is operated to determine the coordinate position and the positional discrepancy error of the alignment marks on the wafer W, the reticle R, or the fiducial mark plate FM.

The main stage control system 260 is interfaced with an unillustrated operating microcomputer, which is connected to the driving system 254, the main scanning driving system 255, the driving circuit 256, and the driving circuit 253 for driving and controlling the respective linear motors 214, 216, 240, 242, and the reticle fine movement stage 210 respectively.

Among them, the driving circuit 253 servo-controls the reticle fine movement stage 210 on the basis of the command information from the main control system 260 and the respective pieces of positional information PX, PY, Pθ in the X direction, the Y direction, and the rotational (yawing) direction measured by the interferometers RIFx, RIFθ, RIFy disposed on the side of the reticle so that the reticle R is finely moved during alignment and scanning exposure.

The driving system 254 servo-controls the driving of the second linear motor 214 on the basis of the command information from the main control system 260 and the positional information PX (and the velocity information Vx) measured by the interferometer RIFx disposed on the side of the reticle.

The main scanning driving system 255 is principally operated during scanning exposure. The main scanning driving system 255 servo-controls the first linear motor 216 so that the absolute velocity of at least one of the reticle stage body 206 and the first wafer stage body 208 is equal to the velocity command information supplied from the main control system 260, while monitoring any one of or both of the velocity information Vx (or the positional information PX) measured by the interferometer RIFx disposed on the side of the reticle and the velocity information Vx (or the positional information PX) measured by the interferometer WIFx disposed on the side of the wafer.

The driving circuit 256 servo-controls the driving of the pair of linear motors 240, 242 on the basis of the command information from the main control system 260 and the positional information PX, PY, Pθ measured by the interferometers WIFx, WIFy disposed on the side of the wafer.

Next, explanation will be made for the operation during scanning exposure of the exposure apparatus 100 according to the first embodiment constructed as described above. In this explanation, it is assumed that previous preparation has been completed, for example, for the reticle alignment performed by the half TTL alignment detection system 232, the global alignment for the reticle R and the wafer W performed by the TTL alignment detection system 230, and the baseline measurement based on the use of the fiducial plate FM.

At first, in order that a first end in the X axis direction of a predetermined shot area on the wafer W is positioned in the exposure field of the projection optical system PL, the main stage control system 260 gives a command to the main scanning driving system 254 and the driving circuit 256 to drive the linear motor 216 and the linear motors 240, 242. Accordingly, the second wafer stage body 220 is moved in the X direction integrally with the first wafer stage body 208 oppositely to the reticle stage body 206, and it is driven in the Y direction with respect to the first wafer stage body 208. Thus, the first end of the shot area in the X direction is positioned in the exposure field of the projection optical system PL. Next, the main stage control system 260 drives the second linear motor 214 by the aid of the driving system 254 to restore the reticle stage body 206 to the predetermined reset position. Accordingly, the second end of the reticle in the X axis direction coincides with the exposure field of the projection optical system PL. In this procedure, in order to prevent the reticle stage body 206 from change in position in the X direction, the following operation may be performed. Namely, the first linear motor 216 is driven while servo-controlling the second linear motor 214 on the basis of the measured value obtained by the reticle interferometer 250, so that the first and second wafer stage bodies 208, 220 are integrally and singly moved in the X direction over the base structure 200. After that, only the second linear motor 214 is servo-controlled on the basis of the measured value obtained by the reticle interferometer 250, so that the reticle stage body 206 is moved singly in the X direction over the base structure 200.

Next, the main stage control system 260 gives a command to the main scanning driving system 255 to drive the linear motor 216 so that exposure for the shot area is started. In the first embodiment, both of the wafer stage 14 and the reticle stage body 206 are supported in the floating manner over the base structure 200 via the air bearings (air-operated bearings). Accordingly, when a driving current is supplied to the driving coil section 216B of the first linear motor 216, the first wafer stage body 208 and the second wafer stage body 220 are moved, for example, in the +X direction at a velocity Vw in an integrated manner over the upper surface of the base structure 200 in accordance with the law of conservation of momentum, while the reticle stage body 206 is moved in the −X direction at a velocity Vr over the upper surface of the base structure 200. In this process, as described above, the ratio between the total value Mr of the masses of both of the reticle stage body 206 and the reticle fine movement stage 210 and the entire mass Mw of the wafer stage 14 is set to be equal to the reduction magnification 1/4 of the projection optical system PL. Therefore, according to the law of conservation of momentum, the velocity ratio between the reticle stage body 206 and the wafer stage 14 is 4:1, regardless of the state of acceleration, constant velocity, or deceleration. Namely, the velocity ratio is equal to the reciprocal number of the reduction magnification Mp1. Therefore, when only one of the velocities (or positions) or the wafer stage 14 and the reticle stage body 206 is servo-controlled, the both can be always reliably subjected to synchronous scanning.

In this procedure, the absolute values of the respective scanning velocities Vw, Vr (velocities with respect to the base structure 200) determine the amount of exposure light given onto the wafer W during scanning exposure. Therefore, it is necessary for the main scanning driving system 255 to servo-control the driving of the first linear motor 216, while monitoring the velocity information outputted from any one of the interferometer RIFx for measuring the position in the X direction of the reticle stage body 206 and the interferometer WIFx for measuring the position in the X direction of the first wafer stage body 208, so that the velocity thereof becomes a designated constant value.

For example, when the reticle stage body 206 is servo-controlled, even if the reticle stage body 206 makes vibrative movement, the wafer stage 14 makes vibrative movement similar to the reticle stage body 206 while maintaining the same velocity ratio as the reciprocal number of the mass ratio. Further, the position of the center of gravity of the system is always constant, because the momentum is conserved. Accordingly, the base structure 200 is never fluctuated. Therefore, the synchronization error between the both is always zero during scanning exposure.

When the exposure for one shot area on the wafer W is completed as described above, the main stage control system 260 drives the linear motors 240, 242 by the aid of the driving circuit 256 to position a shot area adjacent to the shot area which has been exposed on the wafer W, in the exposure field of the projection optical system PL (the stepping is performed). After the positioning, the main stage control system 260 drives the linear motor 216 by the aid of the main scanning driving system 255 to scan the reticle stage body 206 in the direction opposite to the previous direction so that exposure for the shot is started. In this procedure, the wafer stage 14 is scanned in the −X direction at a velocity which is 1/4 of the velocity of the reticle stage body 206. Thereafter, the shot areas on the wafer are subjected to exposure in accordance with the step-and-scan system in the same manner as described above.

As explained above, according to the first embodiment, the following effect is obtained. Namely, the reticle structure 206 and the wafer stage 12 can be always subjected to scanning with no synchronization error of zero by using the simple structure on the basis of the law of conservation of momentum only by setting the mass ratio Mr/Mw between the stage body on the reticle side and the stage body on the wafer side to be equal to the reduction magnification Mp1 of the projection optical system PL, without providing any complicated synchronization control circuit or the like and without using neither stage especially excellent in dynamic characteristics nor special vibration-preventive apparatus such as an active vibration-preventive apparatus. Further, since the reticle stage body 206 and the wafer stage 14 (wafer stage bodies 208, 220) are moved in the mutually opposite directions in accordance of the law of conservation of momentum, the position of the center of gravity in the X direction concerning the entire body including the base structure 200 scarcely changes. Accordingly, the fluctuation of the apparatus is reduced.

In the first embodiment as described above, the linear motor 216, which extends in the scanning direction (X direction), is arranged between the reticle stage body 206 and the substrate stage (wafer stage bodies 208, 220). The wafer stage 14 is supported by the air bearings so that it is moved linearly in the X direction in the non-contact manner over the base structure 200. The reticle stage body 206 is supported by the air bearings so that it is moved linearly in the X direction in the non-contact manner over the base structure 200.

Therefore, the relative positional relationship in the X direction between the reticle R and the wafer W is controlled in accordance with the law of conservation of momentum during the period in which the driving current is supplied to the driving coil section 216B of the linear motor 216. However, when the electric power supply to the linear motor 216 is interrupted, the system loses the restricting force for retaining the relative positional relationship in the X direction between the reticle stage body 206 and the wafer stage 14.

For this reason, there is a possibility that the relative positional relationship in the X direction between the reticle stage body 206 and the wafer stage 14 may be gradually discrepant due to, for example, vibration from vibration sources (other motors or the like) in the exposure apparatus, which would appear when the electric power supply to the linear motor 216 is interrupted, vibration from, for example, an air conditioner disposed outside the exposure apparatus, vibration of the floor on which the exposure apparatus is installed, and slight inclination of the entire exposure apparatus.

In this context, the linear motor 216 may be a linear motor which is allowed to perform servo-control so that the relative displacement in the X direction between the reticle stage body 206 and the wafer stage 14 is maintained to be zero, by modifying, for example, the coil arrangement of the linear motor 216, the winding structure of the respective coils, and the supply control for the driving current. In such an arrangement, it is possible to easily obtain a stationary relative positional relationship in the X direction between the reticle R and the wafer w only by controlling the supply current to the linear motor 216. However, even in such a case, there is a possibility that the reticle stage body 206 and the wafer stage 14 make discrepancy in the X direction over the base structure 200 in an integrated manner due to, for example, various vibrations and inclination of the exposure apparatus.

In any case, it is a fact for the reticle stage body 206 that the wafer stage 14 is discrepant with respect to the base structure 200. This fact means that a change occurs in the relative positional relationship in the X direction to be set upon the start of scanning exposure between the reticle R and the optical axis (or the illumination light beam) of the illumination system 212 fixed to the base structure 200. Such a change may seriously affect the exposure sequence based on the step-and-scan system.

The second linear motor 214 functions in order to dissolve the inconvenience as described above. Namely, in the exposure apparatus 100 according to the first embodiment, in addition to the first linear motor 216 for controlling the relative positional relationship between the reticle stage body 206 and the wafer stage 14 (wafer stage bodies 208, 220) at the velocity ratio in accordance with the law of conservation of momentum, there is provided the second linear motor 214 for controlling the absolute position of the reticle stage body 206 with respect to the base structure 200. Accordingly, the electric power supply terminal of the driving coil section 214B of the second linear motor 214 may be opened to give a no-loaded state when the reticle stage body 206 and the wafer stage 14 (wafer stage bodies 208, 220) are moved in the opposite directions during scanning exposure in accordance with the law of conservation of momentum. On the other hand, when the absolute position of the reticle stage body 206 is controlled, the second linear motor 214 may be servo-controlled on the basis of the positional information and the velocity information from the interferometer RIFx for measuring the position of the reticle stage body 206 in the X direction with respect to the base structure 200.

Therefore, the position of the reticle R with respect to the illumination light beam can be always managed accurately by controlling the respective linear motors in an associated manner in accordance with a wafer exposure sequence based on the S&S system.

Further, the positional relationship of the reticle R and the wafer W with respect to the base structure 200 after completion of the exposure process can be made unchanged from the positional relationship established when the exposure process is started. Accordingly, the present invention is also advantageous in that the discrepancy in the receiving position is avoided, for example, between the apparatus and an arm of an automatic conveying mechanism when the reticle is exchanged or when the wafer is exchanged.

The first embodiment has been illustrated by using the case based on the use of the inverting type optical system as the projection optical system in which the inverted image of the pattern on the reticle R is projected onto the wafer W. However, for example, when a vertically symmetrical circuit pattern is subjected to exposure, it is possible to use, as the projection optical system, an erecting type optical system in which an erecting image of a circuit pattern is formed on a photosensitive substrate.

Further, the first embodiment has been exemplified by the case in which the reduction magnification of the projection optical system is 1/4. However, any of magnifications may be used as the reduction magnification of the projection optical system. For example, even when the reduction magnification is one-fold (1× magnification), the present invention has a great merit because of the following reason. Namely, according to the present invention, the position of the center of gravity of the system is not moved due to any movement of the stage, because the momentum is conserved. Therefore, the body is not fluctuated by the reaction force caused by the movement of the stage. Accordingly, it is unnecessary to use any expensive vibration-preventive apparatus or the like, such as an active vibration-preventive apparatus. Moreover, even when one of the stages is moved in a vibrative manner, the other stage is moved in the same vibrative manner in accordance therewith. Thus, no synchronization error occurs.

Second Embodiment

Figure 5:
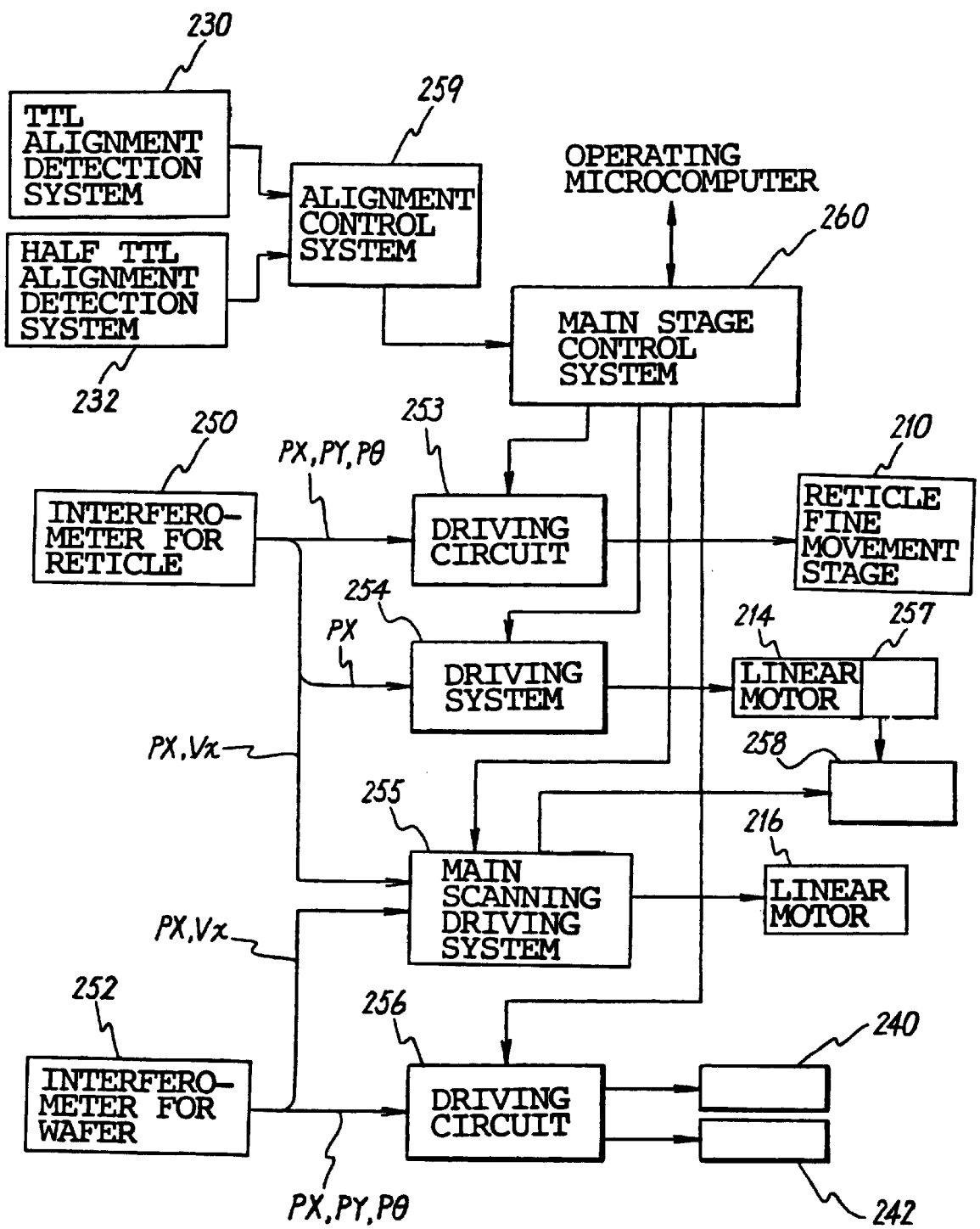
FIG. 5 shows a block diagram illustrating an arrangement of a control system of an apparatus according to a second embodiment.

Next, a second embodiment according to the present invention will be explained with reference to FIG. 5. In this embodiment, the same or equivalent components as those described in the first embodiment are designated by the same reference numerals, explanation of which will be simplified or omitted. As shown in FIG. 5, the second embodiment is characterized in that a power-generating coil 257 and a load circuit 258 for regenerative braking for consuming the current supplied from the coil 257, which are operatively linked to the linear motor 214, are additionally provided. The other components of the control system and the other apparatus system and arrangement are the same as those described in the first embodiment.

In the second embodiment, the second linear motor 214 is utilized to provide a regenerative braking circuit for finely adjusting the velocity ratio between the reticle stage body 206 and the wafer stage 14 (wafer stage bodies 208, 220) during scanning exposure, for example, within a range of about ±0.1% at a resolving power of an order of p.p.m. Specifically, the power-generating coil 257 and the load circuit 258 are provided as shown in FIG. 5 to finely change the transfer magnification concerning the scanning direction (assuming that the designed dimension in the scanning direction on the wafer W is 35 mm, expansion or contraction is made therefor only by about several hundreds nm as a whole).

This arrangement will be described in further detail below. The power-generating coil 257 is constructed by providing a special power-generating coil in the second linear motor 214, or by using the driving coil also for power generation. The load circuit 258 (including an appropriate load resistor) is connected to the terminal of the power-generating coil during the period in which the reticle stage and the wafer stage are moved in the opposite directions by means of the first linear motor 216 so that the regenerative control is performed. Thus, the dynamic load in the X direction of the reticle stage body 206 is increased to minutely change the amount of the velocity ratio between the reticle stage body 206 and the wafer stage 14.

In order to control the amount of regenerative braking, the load circuit 258 may be constructed such that the current from the power-generating coil 257 is allowed to flow to the load resistor via a high-speed switching element or the like to vary, in a wide range, the ON/OFF frequency of the switching element, the duty ratio of the ON time and the OFF time or the like.

In this embodiment, in order to precisely make fine adjustment for the velocity ratio Vw/Vr with respect to the reduction magnification Mp1, the power-generating coil 257 (see FIG. 5), which is integrated with the driving coil section 214B of the second linear motor 214, and the load circuit 258 are utilized to make control so that a dynamic load is applied to the movement direction of the reticle stage body 206. The load circuit 258 acts as a variable load resistor for the power-generating circuit 257, and it has a function to substantially continuously change the current obtained from the power-generating coil 257 in accordance with a control command supplied from the main scanning driving circuit 255.

During the scanning exposure, the reticle stage body 206 may be primarily moved at the velocity Vr. However, when the appropriate load resistor is connected to the terminal of the power-generating coil 257, then the momentum, which corresponds to the energy consumed by the load resistor, is added to the reticle stage body 206. The addition corresponds to the increase in apparent mass Mr of the reticle stage body 206 by a minute amount. Accordingly, the velocity ratio Vw/Vr between the wafer stage 14 and the reticle stage body 206 is finely adjusted.

In such a situation, the action is made only in the direction to increase the apparent mass of the reticle stage body 206. Accordingly, the mass ratio Mr/Mw is increased, and the velocity ratio Vw/Vr is adjusted in a direction to achieve Mp1<(Vw/Vr). Therefore, the velocity ratio may be matched with the reduction magnification by previously setting the masses of the respective stage bodies so that the mass ratio Mr/mw in the stationary state is slightly smaller than the reduction magnification Mp1, and always adjusting the regenerative braking amount appropriately during scanning exposure.

On the other hand, when the wafer stage 14 and the reticle stage body 206 are subjected to scanning movement in the mutually opposite directions in accordance with the law of conservation of momentum, if the electric power is supplied to the driving coil section 214B of the second linear motor 214 to be simultaneously used for the driving of the reticle stage body 206, then the apparent dynamic mass of the reticle stage body 206 can be slightly decreased. Accordingly, it is also possible to adjust the velocity ratio Vw/Vr in a direction to achieve Mp1>(Vw/Vr).

According to the second embodiment of the present invention as described above, the scanning velocity ratio between the reticle R and the wafer W during scanning exposure can be finely adjusted extremely easily by controlling the regenerative braking amount (the current value from the power-generating coil). Accordingly, when the velocity ratio between the reticle R and the wafer W is detected from the results of measurement performed by the interferometers to apply feedback control for the regenerative braking amount so that the detected value is a previously set value, then the transfer magnification concerning the scanning direction can be evenly subjected to fine adjustment. Moreover, it is also possible to adjust the transfer strain (distortion) by delicately changing the velocity ratio at the scanning start portion and the velocity ratio at the scanning end portion of a shot area on the wafer W, and the velocity ratio at the central portion of the shot area.

In the first and second embodiments described above, the linear motor 214 is provided in order to move the reticle stage body 206 singly in the scanning direction over the base structure 200. However, in place of the linear motor 214 or together with the linear motor 214, a third linear motor for generating the thrust force in the X direction may be provided between the base structure 200 and the first wafer stage body 208 in order to reliably rest the first and second wafer stage bodies 208, 220 at certain positions in the X direction, and singly move the first and second wafer stage bodies 208, 220 over the base structure 200. In this arrangement, the third linear motor may be servo-controlled on the basis of a measured value obtained by the wafer interferometer 252 (WIFx).

Next, concerning the case in which the unillustrated third linear motor is added to the apparatus according to the second embodiment, explanation will be made for a series of sequences to perform scanning exposure by making alignment for the pattern area on the reticle R and the shot area on the wafer W.

(1) The reticle stage body is moved to the loading position, and the reticle R is installed on the stage. At this time, the wafer stage 14 may be moved in the opposite direction in accordance with the law of conservation of momentum associated with the movement of the reticle stage body. Alternatively, the wafer stage 14 may be forcedly rest at a predetermined position by servo-controlling the third linear motor.

(2) The respective stage bodies 206, 208, 220 are moved so that the reticle stage body 206 and the wafer stage body 220 are set at predetermined positions in relation to the image field of the projection optical system. The reference mark fixed on the wafer stage body 220 and the alignment mark formed on the reticle R are mutually photoelectrically detected by using the alignment detection system 232 via the projection optical system PL. The fine movement stage 210 on the reticle stage body 206 is controlled so that the reticle R is consistently adjusted in the respective directions of X, Y, θ with respect to the movement coordinate system of the wafer stage body 220. At the point of time at which the reticle R is adjusted consistently with the movement coordinate system of the wafer stage body 220, the X, Y measured value obtained from the reticle interferometer 250 and the X, Y measured value obtained from the wafer interferometer 252 are stored as the achievement position for primary consistent adjustment. Thereafter, the system is managed so that the positional relationship is immediately reproduced.

(3) In order to place the wafer W on the wafer stage body 220, the wafer stage body 220 is moved to a predetermined loading position. After that, the wafer stage body 220 is moved so that the respective alignment marks, which are formed in association with several shot areas on the wafer W, are arranged one by one in the field of the projection optical system PL. The respective alignment marks are successively detected by using the alignment detection system 230 by the aid of the projection optical system PL. The relative positional relationship (in the X, Y, θ directions) between the arrangement coordinate system of the shot area on the wafer W and the pattern area on the reticle R is determined on the basis of results of the foregoing detection.

(4) If the determined positional relationship involves positional discrepancy in the X direction, the first linear motor 216 is driven to move the reticle stage body 206 in the X direction with respect to the wafer stage 14 in a state in which the third linear motor is driven to make servo-lock so that the wafer stage 14 is not displaced with respect to the base structure. The relative positional error in the Y direction between the shot array coordinate system on the wafer W and the pattern area on the reticle R is corrected by the wafer stage body 220 or by the fine movement stage 210 disposed on the reticle stage body 206. The relative positional error in the θ direction is corrected by minute rotation of the wafer stage body 220 effected by the linear motors 240, 242. It is noted that a θ stage may be additionally provided on the wafer stage body 220.

(5) At the point of time at which the pattern area on the reticle R and the shot array coordinate system on the wafer W are subjected to precise consistent adjustment in relation to the X, Y, θ directions, the relative positional relationship in the X, Y directions between the reticle stage body 206 and the wafer stage body 220 is read by using the interferometers, and it is stored as a secondary consistent arrangement achievement position. The secondary consistent arrangement achievement position is utilized as a management reference for the movement positions of the respective stage bodies during the period of exposure process for the wafer W.

(6) Next, the reticle stage body 206 is positioned in the X direction so that the pattern area on the reticle R is located at the position to start irradiation with the illumination light beam. The wafer stage 14 is positioned in the X direction so that one shot area on the wafer W is located at the position to start exposure.

(7) The first linear motor 216 is driven to move the reticle stage body 206 and the wafer stage 14 in the opposite directions at the predetermined velocity ratio corresponding to the image formation magnification Mp1 of the projection optical system PL in accordance with the law of conservation of momentum. During this process, if it is necessary to make suppression to be within an allowable range concerning variation in the velocity ratio between the both stages, the fine adjustment for the transfer magnification in relation to the scanning direction may be performed such that the second linear motor 214 and the third linear motor are actively controlled on the basis of a precise result of measurement for the change in velocity ratio (or the change in relative positional relationship) to continuously and finely adjust the apparent dynamic mass of the reticle stage body 206 or the wafer stage 14.

Modified Embodiment

Figure 6A:
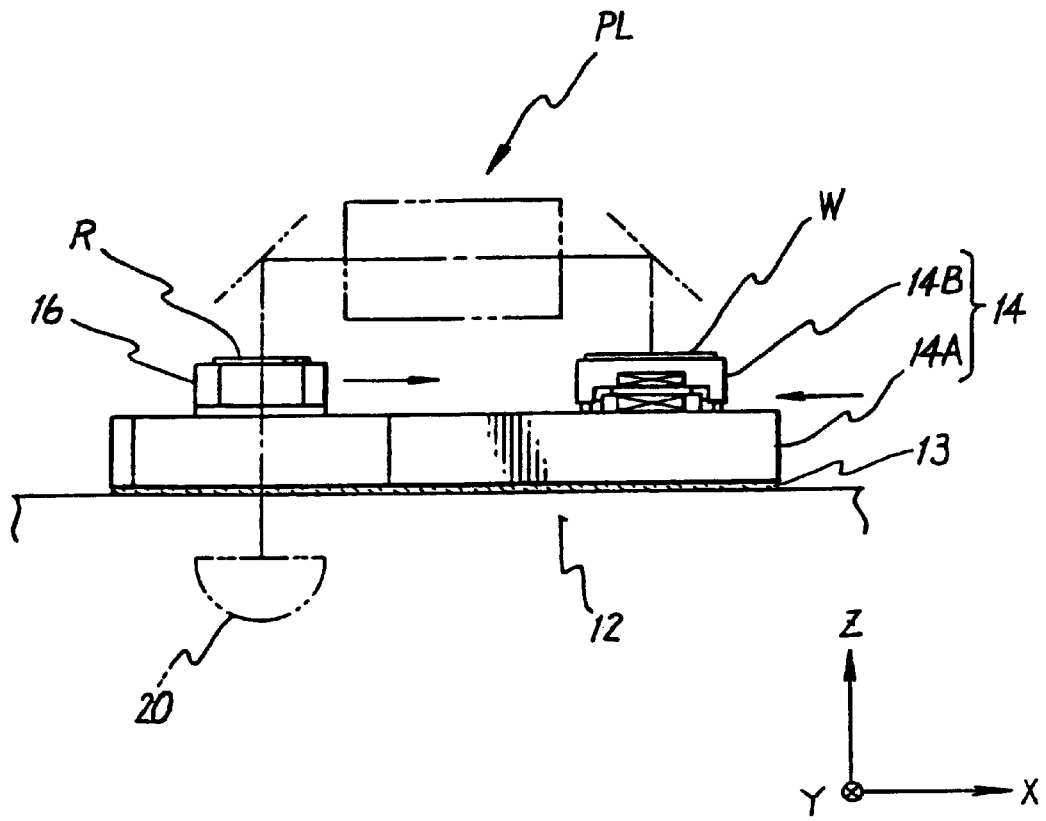
FIG. 6A shows a schematic front view concerning a modified embodiment of the exposure apparatus according to the present invention.

Next, a modified embodiment will be explained with reference to FIGS. 6A and 6B.

An exposure apparatus according to this modified embodiment is characterized in that not only the wafer W as a photosensitive substrate is held horizontally, but also the reticle R as a mask is held horizontally on the reticle stage 16.

The exposure apparatus comprises a reticle stage 16 and a substrate stage 14 supported in a floating manner over a pedestal 12 via an air bearing (air-operated bearing) 13, a projection optical system PL composed of a reflecting optical system for reduction-projecting a circuit pattern, and a light source 20.

In the exposure apparatus according to this modified embodiment, the substrate stage 14 has a first stage 14A which is supported in a floating manner over the pedestal 12 and which is movable in the X axis direction, and a second stage 14B which is driven on the first stage 14A in the Y axis direction by the aid of a linear motor. The wafer W is held on the second stage 14B.

Figure 6B:
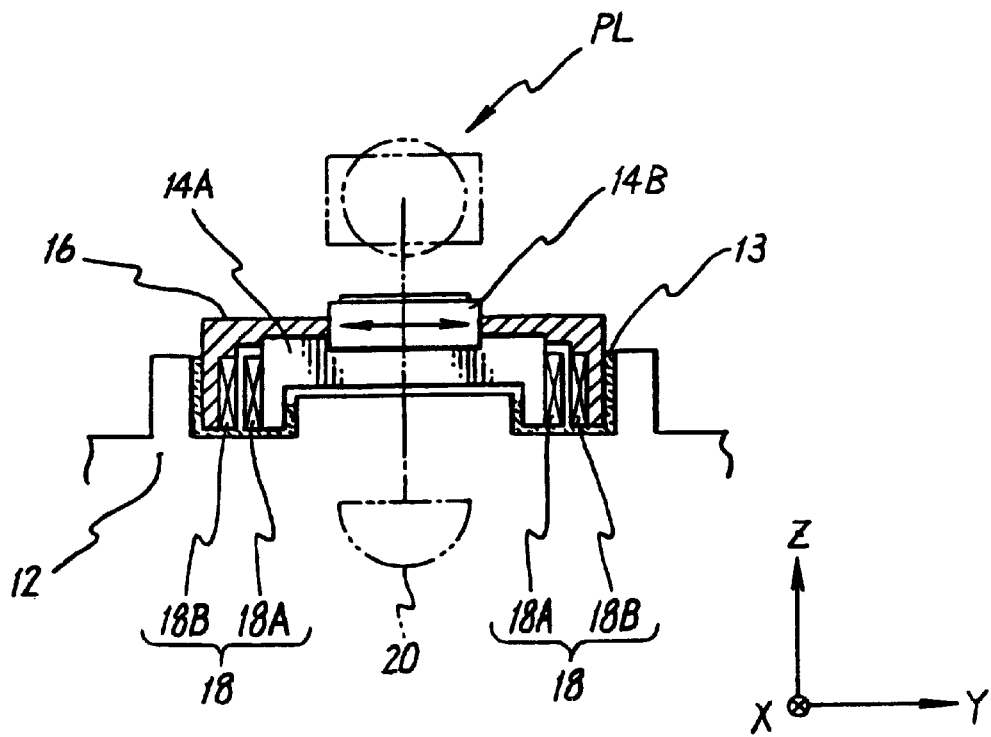
FIG. 6B shows a right side view of the modified embodiment of the exposure apparatus shown in FIG. 6B.

As shown in FIG. 6B, the reticle stage 16 is arranged such that it rides on a first stage 14A. Linear motors 18, 18, each of which is composed of a coil 18A and a magnet 18B, are interposed between the both stages 16, 14A.

When the reticle R is illuminated with an exposure light beam radiated from the underlying light source 20 via an unillustrated illumination optical system, an image of a circuit pattern located in a slender illumination area (corresponding to an exposure field of the projection optical system) is reduction-projected onto the wafer W via the projection optical system PL.

Therefore, the same effect as described above is also obtained in the case of the modified embodiment such that the circuit pattern is subjected to scanning exposure while maintaining the synchronization error between the both stages 16, 14 to be always zero in the same manner as the foregoing respective embodiments, provided that the ratio of the masses of the reticle stage 16 and the substrate stage 14 is set to be identical with the reduction magnification Mp1 of the projection optical system PL.

The first and second embodiments described above have been exemplified by the case in which the photosensitive substrate is held horizontally on the substrate stage, i.e., the lateral type substrate stage is used. However, the present invention is applicable to an exposure apparatus which uses a substrate stage in which the photosensitive substrate is held vertically on the substrate stage, i.e., a vertical type substrate stage is used.

The first and second embodiments described above have been exemplified by the case in which the linear motor is used as the driving means for driving the second stage in the non-scanning direction. However, the present invention is not limited thereto. The exposure apparatus may be constructed such that the second stage is driven in the non-scanning direction by using a feed screw mechanism.

As described above, the projection optical system PL used in the first embodiment is disclosed and described in detail in Japanese Laid-Open Patent Publication Nos. 5-88087 and 6-300973 and in U.S. Patents corresponding thereto, the disclosure of which are incorporated herein by reference. Exposure apparatuses and exposure methods based on the step-and-scan system, to which the present invention is applicable, are disclosed in Japanese Laid-Open Patent Publication Nos. 56-111218, 2-229423, and 4-277612 and in U.S. Patents corresponding thereto, the disclosures of which are incorporated herein by reference.

As described above, according to the present invention, the following excellent effects, which have not been obtained by the conventional techniques, are obtained by using the simple structure. Namely, the stress generated in the structural components of the apparatus is reduced, the inclination and the fluctuation of the entire apparatus are suppressed, and the synchronization performance can be improved for the mask stage and the substrate stage.

What is claimed is:

1. A scanning exposure method for transferring a pattern formed on a mask onto a substrate through a projection optical system, the scanning exposure method comprising the steps of:

arranging the mask and the substrate in an identical plane perpendicular to an optical axis of the projection optical system;

projecting a partial inverted image of the pattern formed on the mask onto the substrate; and synchronously moving the mask and the substrate oppositely to one another along predetermined directions on the plane so that a reactive force generated by the synchronous movement is substantially offset.

2. The scanning exposure method according to claim 1, wherein the mask and the substrate are synchronously moved at a velocity ratio corresponding to a magnification of the projection optical system.

3. The scanning exposure method according to claim 1 wherein in order to perform overlay transfer of the pattern on the mask onto a pattern on the substrate, a velocity ratio between the mask and the substrate is adjusted during the synchronous movement so that at least one of a magnification error and a distortion error between the pattern on the substrate and the image of the pattern on the mask is corrected.

4. A method for fabricating a micro-device by exposing the substrate with the pattern formed on the mask using the scanning exposure method according to claim 1.

5. An exposure method for transferring a pattern formed on a mask held on a mask stage onto a substrate held on a substrate stage, the exposure method comprising:

moving one stage of the mask and substrate stages in a predetermined direction, and moving the other stage of the mask and substrate stages in an opposite direction to the predetermined direction in synchronization with a movement of the one stage so as to decrease a force generated by the movement of the one stage and to coincide a momentum of the mask stage with a momentum of the substrate stage.

6. The exposure method according to claim 5, wherein movement of the mask and substrate stages is performed by activating a driving member which is disposed between the stages, the driving member moving one stage of the stages in a predetermined direction and the other stage of the stages in an opposite direction to the predetermined direction in synchronization with a movement of the one stage.

7. The exposure method according to claim 5, wherein the pattern is transferred onto the substrate through a projection optical system which transfers the pattern with a predetermined magnification.

8. The exposure method according to claim 7, wherein the substrate stage has a predetermined mass, and the mask stage has a mass determined by multiplying the predetermined mass with the predetermined magnification.

9. The exposure method according to claim 7, wherein the projection optical system projects an inverted image of the pattern formed on the mask onto the substrate.

10. The exposure method according to claim 6, wherein the stages are supported in a floating manner over a base member.

11. The exposure method according to claim 10, wherein the stages are supported in the floating manner over the base member via an air bearing.

12. The exposure method according to claim 11, wherein the air bearing is a vacuum-preloaded air bearing.

13. The exposure method according to claim 7, wherein the mask and substrate stages synchronously move at a velocity ratio in accordance with the predetermined magnification of the projection optical system.

14. The exposure method according to claim 13, further comprising adjusting the velocity ratio at which the mask and substrate stages are synchronously moved.

15. The exposure method according to claim 5, wherein the mask is moved on a predetermined plane by the mask stage, and the substrate is moved on a plane perpendicular to the predetermined plane by the substrate stage.

16. The exposure method according to claim 7, wherein the mask is moved on a plane perpendicular to an optical axis of the projection optical system by the mask stage, and the substrate is moved on a plane which is substantially the same as the plane perpendicular to the optical axis of the projection optical system by the substrate stage.

17. The exposure method according to claim 10, wherein the mask stage is moved by an electromagnetic force of a second driving member which is disposed between the base member and the mask stage.

18. The exposure method according to claim 17, wherein the substrate stage is moved by an electro-magnetic force of a third driving member which is disposed between the base member and the substrate stage.

19. The exposure method according to claim 7, wherein the projection optical system includes a plurality of transmission optical elements, a beam splitter and a reflection optical element, and the projection optical system transfers the pattern formed on the mask onto the substrate with a predetermined reduction magnification.

20. The exposure method according to claim 19, wherein both of an alignment mark formed on the mask and an alignment mark formed on the substrate are detected using the beam splitter.

21. A method for fabricating a micro-device by exposing the substrate with the pattern formed on the mask using the scanning exposure method according to claim 5.

22. The exposure method according to claim 6, wherein the driving member moves the mask and substrate stages by an electromagnetic force.

23. The exposure method according to claim 22, wherein the driving member includes a linear motor.

24. An exposure method for transferring a pattern formed on a mask held on a mask stage onto a substrate held on a substrate stage, the exposure method comprising:
    activating a driving member which is disposed between the mask stage and the substrate stage and which moves one stage of the mask and substrate stages in a predetermined direction and the other stage of the mask and substrate stages in an opposite direction to the predetermined direction in synchronization with a movement of the one stage.

25. The exposure method according to claim 24, wherein the driving member moves the mask and substrate stages by an electromagnetic force.

26. The exposure method according to claim 25, wherein the driving member includes a linear motor.

27. A method for fabricating a micro-device by exposing the substrate with the pattern formed on the mask using the scanning exposure method according to claim 24.

28. The exposure method according to claim 24, wherein the pattern is transferred onto the substrate through a projection optical system which transfers the pattern with a predetermined magnification.

29. The exposure method according to claim 28, wherein the substrate stage has a predetermined mass, and the mask stage has a mass determined by multiplying the predetermined mass with the predetermined magnification.

30. The exposure method according to claim 28, wherein the projection optical system projects an inverted image of the pattern formed on the mask onto the substrate.

31. The exposure method according to claim 28, wherein the mask and substrate stages synchronously move at a velocity ratio in accordance with the predetermined magnification of the projection optical system.

32. The exposure method according to claim 31, further comprising adjusting the velocity ratio at which the mask and substrate stages are synchronously moved.

33. The exposure method according to claim 28, wherein the mask is moved on a plane perpendicular to an optical axis of the projection optical system by the mask stage, and the substrate is moved on a plane which is substantially the same as the plane perpendicular to the optical axis of the projection optical system by the substrate stage.

34. The exposure method according to claim 28, wherein the projection optical system includes a plurality of transmission optical elements, a beam splitter and a reflection optical element, and the projection optical system transfers the pattern formed on the mask onto the substrate with a predetermined reduction magnification.

35. The exposure method according to claim 34, wherein both of an alignment mark formed on the mask and an alignment mark formed on the substrate are detected using the beam splitter.

36. The exposure method according to claim 24, wherein the mask is moved on a predetermined plane by the mask stage, and the substrate is moved on a plane perpendicular to the predetermined plane by the substrate stage.

37. An exposure method for transferring a pattern formed on a mask onto a substrate, the exposure method comprising:
    moving the mask on a predetermined plane, and
    moving the substrate on a plane substantially perpendicular to the predetermined plane.

38. The exposure method according to claim 37, wherein the pattern is transferred onto the substrate through a projection optical system which transfers the pattern with a predetermined magnification.

39. The exposure method according to claim 38, wherein the projection optical system projects an inverted image of the pattern formed on the mask onto the substrate.

40. The exposure method according to claim 38, wherein the substrate is moved by a substrate stage having a predetermined mass, and the mask is moved by a mask stage having a mass determined by multiplying the predetermined mass with the predetermined magnification.

41. The exposure method according to claim 40, wherein the mask and substrate stages are synchronously moved at a velocity ratio in accordance with the predetermined magnification of the projection optical system.

42. The exposure method according to claim 37, wherein the mask moves in a predetermined direction on the predetermined plane, and the substrate moves in an opposite direction to the predetermined direction on the plane perpendicular to the predetermined plane in synchronization with a movement of the mask.

43. The exposure method according to claim 40, wherein the mask and substrate stages are supported in a floating manner over a base member.

44. The exposure method according to claim 38, wherein the projection optical system includes a plurality of transmission optical elements, a beam splitter and a reflection optical element, and the projection optical system transfers the pattern formed on the mask onto the substrate with a predetermined reduction magnification.

45. The exposure method according to claim 44, wherein both of an alignment mark formed on the mask and an alignment mark formed on the substrate are detected using the beam splitter.

46. The exposure method according to claim 40, wherein the mask and the substrate are synchronously moved by activating an electromagnetic driving member disposed between the mask stage and the substrate stage.

47. A method for fabricating a micro-device by exposing the substrate with the pattern formed on the mask using the scanning exposure method according to claim 37.

48. An exposure method for transferring a pattern formed on a mask onto a substrate through a projection optical system having a predetermined projection magnification, the exposure method comprising:
moving the mask, which is disposed at a side with respect to the projection optical system, in a predetermined direction, and
moving the substrate, which is disposed at the side with respect to the projection optical system, in an opposite direction to the predetermined direction in synchronization with the movement of the mask.

49. The exposure method according to claim 48, wherein the projection optical system projects an inverted image of the pattern formed on the mask onto the substrate.

50. The exposure method according to claim 48, wherein the substrate is moved by a substrate stage having a predetermined mass, and the mask is moved by a mask stage having a mass determined by multiplying the predetermined mass with the predetermined projection magnification.

51. The exposure method according to claim 50, wherein the mask and substrate stages are supported in a floating manner over a base member.

52. The exposure method according to claim 50, wherein the mask and the substrate are synchronously moved by activating an electromagnetic driving member arranged between the mask stage and the substrate stage.

53. The exposure method according to claim 48, wherein the pattern is projected onto the substrate to expose the substrate by illuminating the mask with an illumination light and directing the light passed through the mask to the substrate through the projection optical system.

54. The exposure method according to claim 53, wherein the mask is held on a mask stage supported on a base member, and the mask is illuminated by the illumination light from an opposite side of the mask stage with respect to the base member.

55. The exposure method according to claim 48, wherein the stages are synchronously moved at a velocity ratio in accordance with the predetermined projection magnification.

56. A method for fabricating a micro-device by exposing the substrate with the pattern formed on the mask using the scanning exposure method according to claim 48.

57. An exposure method for exposing a substrate with a pattern formed on a mask, the exposure method comprising:
moving the mask on a predetermined plane, and
moving the substrate on a plane which is substantially the same as the predetermined plane.

58. The exposure method according to claim 57, wherein the pattern is transferred onto the substrate through a projection optical system which transfers the pattern with a predetermined magnification.

59. The exposure method according to claim 58, wherein the projection optical system projects an inverted image of the pattern formed on the mask onto the substrate.

60. The exposure method according to claim 58, wherein the substrate is moved by a substrate stage having a predetermined mass, and the mask is moved by a mask stage having a mass determined by multiplying the predetermined mass with the predetermined magnification.

61. The exposure method according to claim 60, wherein one stage of the mask and substrate stages is arranged so as to straddle the other stage.

62. The exposure method according to claim 58, wherein the mask and the substrate are synchronously moved at a velocity ratio in accordance with the predetermined magnification.

63. The exposure method according to claim 60, wherein the mask and substrate stages are supported in a floating manner over a base member.

64. The exposure method according to claim 60, wherein the mask and the substrate are synchronously moved by activating an electromagnetic driving member arranged between the mask and substrate stages.

65. The exposure method according to claim 57, wherein the mask is held on a mask stage supported on a base member, and the mask is illuminated from an opposite side of the mask stage with respect to the base member.

66. A method for fabricating a micro-device by exposing the substrate with the pattern formed on the mask using the scanning exposure method according to claim 57.

67. A scanning exposure method which sequentially transfers a pattern formed on a mask onto a plurality of shot areas on a substrate held on a substrate stage which is movable on a two-dimensional plane, the method comprising:
moving the substrate stage so that the plurality of shot areas are sequentially aligned with an exposure starting position at which transfer of the pattern is started;
moving the substrate stage during the transfer of the pattern;
moving a movable object in synchronization with the movement of the substrate stage by activating a first driving member disposed between the substrate stage and the movable object so that a momentum of the substrate stage is equal to a momentum of the movable object when the substrate stage is moved during the transfer of the pattern; and
adjusting a positional relationship between a predetermined reference and the movable object or the substrate stage by activating a second driving member which moves the movable object or the substrate stage independently of the substrate stage or the movable object, respectively, wherein the second driving member is used along with the first driving member for at least a period during the synchronized movement of the movable object and the substrate stage.

68. The scanning exposure method according to claim 67, wherein the substrate stage moves in a predetermined direction and the movable object moves in an opposite direction thereto by activating the first driving member.

69. The scanning exposure method according to claim 68, wherein the first driving member is a linear motor.

70. The scanning exposure method according to claim 69, wherein the momentum of the substrate stage is not equal to the momentum of the movable object when the substrate stage is moved to be aligned with the exposure starting position.

71. The scanning exposure method according to claim 70, wherein the movable object is a mask stage.

72. The scanning exposure method according to claim 71, wherein the pattern is projected onto the substrate through a projection optical system which projects the pattern onto the substrate with a predetermined magnification, and the mask stage has a mass obtained by multiplying a mass of the substrate with the magnification of the projection optical system.

73. The scanning exposure method according to claim 71, wherein the pattern is projected onto the substrate through a projection optical system which projects the pattern onto the substrate with a predetermined magnification, and the mask and the substrate stages are moved at a velocity ratio corresponding to the magnification of the projection optical system when the mask and the substrate stages are synchronously moved.

74. A method for making a device, comprising a step of transferring a device pattern onto the substrate using the scanning exposure method defined in claims 67.

75. The scanning exposure method according to claim 67, wherein the substrate stage moves in a friction-less manner during transfer of the pattern onto the substrate.

76. The scanning exposure method according to claim 75, wherein the substrate stage is supported in a floating manner over a base member with a predetermined clearance therebetween.

77. The scanning exposure method according to claim 76, wherein the substrate stage is supported in a floating manner by an air-bearing member over the base member.

78. The scanning exposure method-according to claim 76, wherein the movable object moves in a friction-less manner by activating the first driving member.

79. The scanning exposure method according to claim 78, wherein the movable object is supported in a floating manner over the base member with a predetermined clearance therebetween.

80. The scanning exposure method according to claim 79, wherein the movable object is supported in a floating manner by an air-bearing member over the base member.

81. The scanning exposure method according to claim 78, wherein the substrate stage is rotatable in a minute amount with respect to a surface of the base member by activating a third driving member which is different from the first and second driving members.

82. The scanning exposure method according to claim 81, wherein the third driving member is a linear motor.

83. The scanning exposure method according to claim 78, wherein the movable object or the substrate stage is subjected to thrust in a moving direction during the synchronized movement by activating the second driving member.

84. The scanning exposure method according to claim 83, wherein the second driving member is a linear motor.

85. The scanning exposure method according to claim 83, wherein the second driving member includes:

a movable object driving member which drives the movable object independently of the substrate stage; and a substrate stage driving member which drives the substrate stage independently of the movable object.

86. The scanning exposure method according to claim 78, wherein the predetermined reference is the base member, the second driving member moving the movable object or the substrate stage solely on the base member.

87. The scanning exposure method according to claim 78, wherein the predetermined reference is an optical axis of an illumination system which irradiates the mask with an illumination beam, the second driving member controlling a starting position, which should be set in starting scanning exposure, in a scanning direction of the movable object or the substrate stage relative to the optical axis when the second driving member is activated without being used along with the first driving member.

88. The scanning exposure method according to claim 67, wherein the second driving member is activated on the basis of a change in speed ratio or a rate of change in positional relationship between the movable object and the substrate stage during the synchronized movement when the second driving member is used along with the first driving member, the second driving member operating to adjust an apparent dynamic mass of the movable object or the substrate stage.

89. The scanning exposure method according to claim 67, wherein the substrate stage is rotatable in a minute amount in the two-dimensional plane by activating a third driving member which is different from the first and second driving members.

90. The scanning exposure method according to claim 89, wherein the third driving member is a linear motor.

91. A scanning exposure method for sequentially transferring a pattern formed on a mask onto a plurality of shot areas on a substrate held on a substrate stage movable on a two-dimensional plane, the method comprising the steps of:

moving the substrate stage so that the shot areas are sequentially aligned with an exposure starting position at which transfer of the pattern is started;

moving the substrate stage while transferring the pattern onto the substrate;

moving a movable object in synchronization with the substrate stage by activating a first linear motor disposed between the substrate stage and the movable object so that a momentum of the substrate stage is equal to a momentum of the movable object when the substrate stage is moved while the pattern is transferred onto the substrate; and adjusting a positional relationship between a predetermined reference and the movable object or the substrate stage by activating a second linear motor which moves the movable object or the substrate stage independently of the substrate stage or the movable object, respectively.

92. The scanning exposure method according to claim 91, wherein the predetermined reference is an optical axis of an illumination system which irradiates the mask with an illumination beam, the second linear motor controlling a starting position, which should be set in starting scanning exposure, in a scanning direction of the movable object or the substrate stage relative to the optical axis.

93. The scanning exposure method according to claim 91, wherein the second linear motor is non-loaded while the movable object is moved in synchronization with the substrate stage by the activation of the first linear motor.

94. The scanning exposure method according to claim 91, wherein the second linear motor is activated along with the first linear motor while the movable object is moved in synchronization with the substrate stage by the activation of the first linear motor.

95. The scanning exposure method according to claim 91, wherein the movable object is a mask stage which holds the mask.

96. A scanning exposure method for sequentially transferring a pattern formed on a mask held on a mask stage movable on a two-dimensional plane onto a plurality of shot areas on a substrate held on a substrate stage movable on a two-dimensional plane, while synchronously moving the mask stage and the substrate stage, the method comprising the steps of:

moving the mask stage and the substrate stage while transferring the pattern onto the substrate;

moving a first movable object and a second movable object in synchronization with the mask stage and the substrate stage, respectively, by activating a first driving member disposed between the first movable object and the mask stage and between the second movable object and the substrate stage so that a momentum of the mask stage is equal to a momentum of the first movable object and a momentum of the substrate stage is equal to a momentum of the second movable object when the mask and substrate stages are moved while the pattern is transferred onto the substrate; and adjusting a positional relationship between a predetermined reference and each of the mask and substrate stages or each of the first and second movable objects by activating a second driving member which moves the mask and substrate stages or the first and second movable objects independently of the first and second objects or the first and second stages, respectively.

97. The scanning exposure method according to claim 96, wherein the first and second driving members are linear motors.

98. The scanning exposure method according to claim 96, wherein the predetermined reference is an optical axis of an illumination system which irradiates the mask with an illumination beam, the second driving member controlling a starting position, which should be set in starting scanning exposure, in a scanning direction of the first and second movable objects or the first and second stages relative to the optical axis.

99. The scanning exposure method according to claim 96, wherein the second driving member is non-loaded while the first and second movable objects are moved in synchronization with the first and second stages, respectively, by the activation of the first driving member.

100. The scanning exposure method according to claim 96, wherein the second driving member is activated along with the first driving member while the first and second movable objects are moved in synchronization with the first and second stages by the activation of the first driving member.

101. The scanning exposure method according to claim 96, wherein the first movable object is the substrate stage, and the second movable object is the mask stage.

* * * * *